United States Patent [19]

van Dijk et al.

[11] Patent Number: 4,501,015

[45] Date of Patent: Feb. 19, 1985

[54] APPARATUS FOR ELECTROACOUSTIC ENERGY CONVERSION

[76] Inventors: Jacobus C. van Dijk, Gouvernestraat 134 b, Rotterdam; Erik von Michalofski, Planetenlaan 408, 3318 JS Dordrecht, both of Netherlands

[21] Appl. No.: 410,677

[22] Filed: Aug. 23, 1982

[30] Foreign Application Priority Data

Sep. 4, 1981 [NL] Netherlands ............. 8104108

[51] Int. Cl.³ .................................... H04R 3/04
[52] U.S. Cl. ...................... 381/103; 333/28 T
[58] Field of Search .................. 381/98, 101, 103; 179/107 FD; 333/28 T

[56] References Cited

U.S. PATENT DOCUMENTS

| | | | |
|---|---|---|---|
| Re. 29,529 | 1/1978 | Heaslett | 381/103 |
| 3,646,270 | 2/1972 | Shiga et al. | |
| 4,052,560 | 10/1977 | Santmann | 381/98 |
| 4,071,782 | 1/1978 | Vidovic | |
| 4,074,070 | 2/1978 | Gaus | |
| 4,176,329 | 11/1979 | Moskowitz | 381/101 |
| 4,340,778 | 7/1982 | Cowans et al. | |

OTHER PUBLICATIONS

"The American Heritage Dictionary of the English Language," Houfflin Mifflin, Co., Boston Mass. 1976, p. 86.

"Van Nostrand's Scientific Encyclopedia," Fifth Edition, Van Nostrand Reinhold Co., N.Y., 1976, p. 234.

Prensky, "Manual of Linear Integrated Circuits," pp. 70-72, Reston Publishing Co., Reston Va., 1974.

Hnatek, "Applications of Linear Integrated Circuits," pp. 57-59, 204-205, Wiley-Intescience Publishing, N.Y., 1975.

Primary Examiner—Keith E. George
Attorney, Agent, or Firm—Ladas & Parry

[57] ABSTRACT

The present invention relates to apparatus for electroacoustic energy conversion and particularly to a conversion apparatus comprising a channel for an electrical signal to be converted, said channel comprising in series connection signal processing circuitry for processing said electrical signal and having in sequence a power amplifier and an electroacoustic transducer, such as a loudspeaker. In accordance with the teachings of the present invention an electroacoustic energy converter apparatus is provided which introduces emphasis in a signal frequency range from 50 kHz up, preferably directly before delivering the signal to the power amplifier stage.

9 Claims, 2 Drawing Figures

APPARATUS FOR ELECTROACOUSTIC ENERGY CONVERSION

BACKGROUND OF THE INVENTION

1. Field of the Invention

The present invention relates to apparatus for electroacoustic energy conversion and particularly to a conversion apparatus comprising a channel for an electrical signal to be converted, said channel comprising in series connection signal processing means for processing said electrical signal and having in sequence a power amplifier and an electroacoustic transducer means, such as a loudspeaker.

2. Description of the Prior Art

An example of an apparatus comprising a channel for an electrical signal to be converted and having in sequence a power amplifier and a loudspeaker, is disclosed in U.S. Pat. No. 4,052,560 issued to J. B. Santmann. Energy conversion in this field is apt to suffer from distortion. The fidelity of the acoustical reproduction of an electrical signal representing a recorded sound signal appears to be frequency dependent. Additional approaches to overcome such distortion as to be attributed to signal conversion in acoustic reproduction apparatus are disclosed in U.S. Pat. No. 3,646,270, issued to T. Shiga et al., U.S. Pat. No. 4,071,782, issued to N. Vidovic, and U.S. Pat. No. Re. 29,529 to A. M. Healett. In each of the disclosures signal equalization is directed to signals or signal portions in the audio frequency range only. Signal processing stops at 20 kHz or below in accordance with conventional considerations of high fidelity reproduction.

However, a loudspeaker or electroacoustical energy conversion device generally has a set of preferred vibration modes. Some of these modes are related to fundamental frequencies of vibration, while others are harmonic modes. Harmonic modes are very likely to be in a frequency range above audio. Harmonic modes absorb energy at the expense of the fundamental mode of vibration. These spurious modes operate as energy sinks since they do not contribute to aural sensations.

SUMMARY OF THE INVENTION

The present invention is useful for improving the performance of any system having an electroacoustic transducer. The apparatus of the present invention provides energy in the ultrasonic frequency range to saturate such spurious sinks. The actual audio frequency energy is thus fully and faithfully converted into mechanical movement that is aurally perceptible. The necessary additional energy is derived from the true audio signal by detecting the leading edge slope or differentiating the signal. Thus, the present apparatus may be thought of as a means for exciting ultrasonic modes which otherwise would have been excited, in any event, by the original audio signal to generate a distorted audio soundwave.

In accordance with the teachings of the present invention an electroacoustic energy converter apparatus is provided which introduces emphasis in a signal frequency range from 50 kHz up, preferably directly before delivering the signal to the power amplifier stage.

This measure according to the invention may also be thought of as boosting small sounds in a frequency range wherein conversion-efficiency is low. As the perceptivity of reproduced sound apparently markedly increases when applying apparatus according to the invention, and in particular when reproducing and/or electrically amplifying music and the human voice, aural perception surprisingly seems to comprise a frequency range up from 50 kHz. In particular the apparatus according to the invention appears to be a hearing aid for persons at and beyond middle age.

These advantages and features of the invention will be further understood from the following description and drawings.

DETAILED DESCRIPTION OF THE PREFERRED EMBODIMENT

Figure 1:
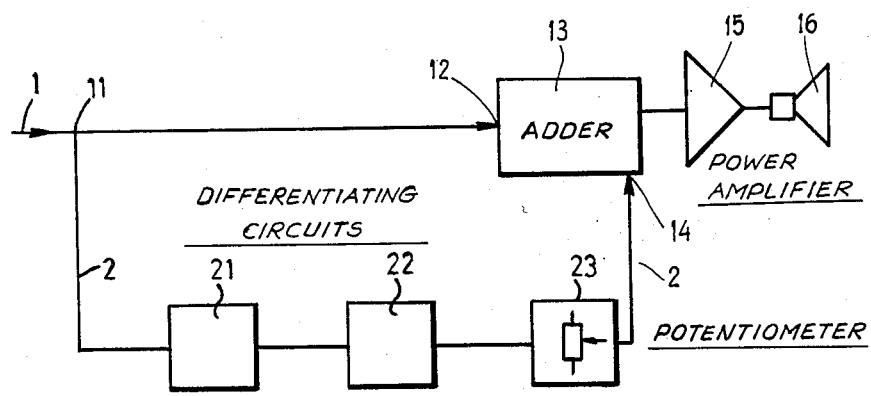
FIG. 1 is a block-diagram of a preferred embodiment of an apparatus according to the invention.

FIG. 1 shows a block-diagram of an apparatus according to the invention. An electrical signal is fed into a channel 1 and subsequently partially branched off into a by-pass channel 2 at an intersection 11. The by-pass channel 2 presents its output signal to an input 14 of an adding circuit 13 in channel 1. A second input 12 is connected to receive a signal from channel 1 downstream from intersection 11. A first active differentiating circuit 21, a second active differentiating circuit 22 and a manually adjustable level control means 23 have been arranged in sequence in the by-pass channel. The output of adding circuit 13 is supplied as an input to power amplifier 15 which in turn feeds speaker 16.

Figure 2:
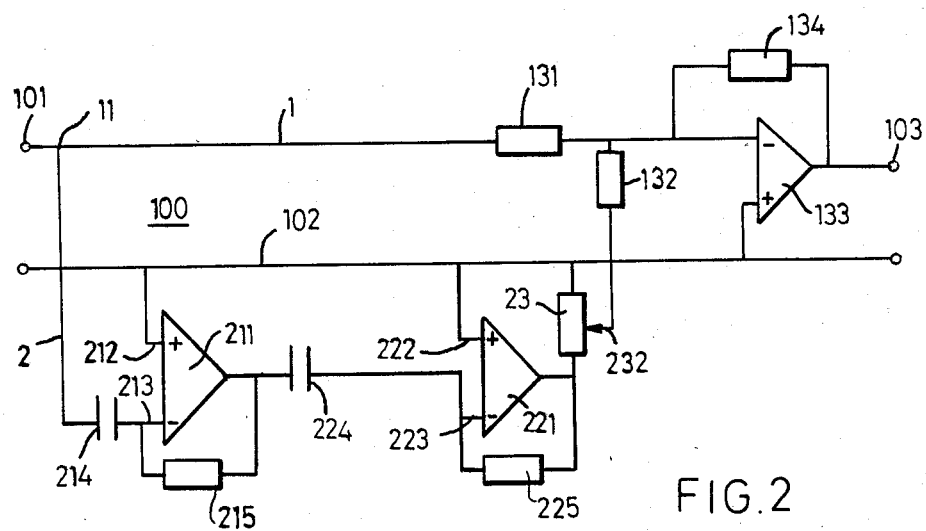
FIG. 2 is a detailed diagram of the embodiment of the invention as shown in FIG. 1.

In FIG. 2, the basic diagram according to FIG. 1 is shown in detail. A channel 100 for transmitting an electric signal to an electroacoustic transducer, has a 2-wire implementation comprising a signal wire having input 101 and output 103 and a reference wire 102.

A fraction signal wire 2 is branched off downstream of input 101 of signal wire 1 at intersection 11. In fraction signal wire 2 two differentiating active circuits, or means for sensing front edge slope in the signal fraction waveform, have been arranged in series connection. Each of the differentiating circuits comprises an operational amplifier (211 and 221 respectively), of which one input (212 and 222 respectively) has been connected to the reference wire 102 and the other input (213 and 223 respectively) is receiving the processed signal fraction. The signal fraction from the intersection 11 is fed through a capacitor 214 to the fraction signal input of the operational amplifier 211 and the output signal of the operational amplifier 211 is fed through a capacitor 224 to the fraction signal input of the operational amplifier 221. The output signal of the operational amplifier 211 is, moreover, fed back to its fraction signal input through a resistor 215. Equally the output of the operational amplifier 221 is fed back to its fraction signal input 223 through a resistor 225. The output signal of the operational amplifier 221 is supplied through a potentiometer 23 to an active adding circuit in channel 100 comprising a series resistor 131 in signal wire 1, a resistor 132 connecting signal wire 1 downstream of series resistor 131 with the movable contact 232 of potentiometer or signal amplitude adjustment means 23, an operational amplifier 133 of which one input is connected to reference wire 102 and the other input is receiving the signal downstream of series resistance 131, and a feedback resistor 134 which is on the one hand connected to the output of operational amplifier 133 and on the other hand to the signal carrying input of operational amplifier 133. The output of operational amplifier 133 is at the same time signal wire output 103 leading to an electroacoustic transducer (not shown). Optionally another power amplifier is connected between output 103 of signal adding means 13 and the electroacoustic transducer.

In an embodiment of the invention according to FIG. 2 both resistors 215 and 225 were rated at 100 kohm and both capacitors 214 and 224 were rated at 1.5 pF. These values produce a time constnat which is clearly less than 1 microsecond. The differentiating circuits thus provided signal amplification from the frequency of 100 kHz upwards. When applied in a sound reproduction system its sound output signal appeared to have markedly improved perceptibility.

We claim:

1. An apparatus for electroacoustical energy conversion comprising:
(a) a first channel for receiving an electrical input signal, said first channel including:
   (i) a signal adder means having a first input supplied with said input signal and an output for supplying a first output signal;
   (ii) a power amplifier for amplifying said first output signal; and
   (iii) an electroacoustic transducer connected to an output of said power amplifier; and
(b) a second channel for receiving a portion of said input signal, said second channel including signal front edge slope sensing means for sensing the front edge slope of said input signal, said slope sensing means providing, only at frequencies above at least 50 kHz, a second output signal to a second input of said signal adder means, whereby said first output signal supplied to said power amplifier represents a sum of said input signal and said second output signal.

2. The apparatus of claim 1 in which the signal front edge slope sensing means is a differentiator means.

3. The apparatus of claim 2 in which the differentiator means comprises:
(a) a first differentiator for differentiating said portion of said input signal to produce a first differentiated signal; and
(b) a second differentiator for differentiating said first signal to produce a second differentiated signal, said second differentiated signal being said second output signal.

4. The apparatus of claim 3 in which said first and second differentiators each provide amplification only at frequencies above 50 kHZ.

5. The apparatus of claim 3 in which the differentiators each have a time contant of 1 microsecond or less.

6. The apparatus of claim 3 in which the differentiators are active circuits.

7. The apparatus of claim 1 in which said second channel further comprises a signal amplitude adjustment means for adjusting the amplitude of said second output signal.

8. The apparatus of claim 1 in which the signal adder means is an active circuit.

9. The apparatus of claim 1 in which said first output signal is supplied directly to said power amplifier.

* * * * *